Figure 4:
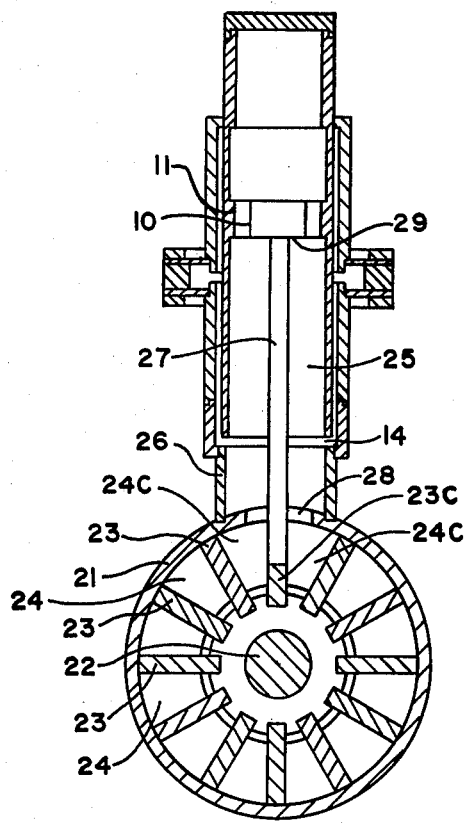

United States Patent [19]

Pickering et al.

[11] 4,105,951
[45] Aug. 8, 1978

[54] MULTIPACTOR DISCHARGE ARRANGEMENTS

[75] Inventors: Alan Hugh Pickering, Springfield; Michael Barry Clive Brady, Maldon; Peter Frederick Lewis, Chelmsford, all of England

[73] Assignee: English Electric Valve Company Limited, England

[21] Appl. No.: 734,883

[22] Filed: Oct. 22, 1976

[30] Foreign Application Priority Data

Oct. 24, 1975 [GB] United Kingdom ............... 43704/75

[51] Int. Cl.² .......................... H01P 1/14; H03B 9/10
[52] U.S. Cl. .................................. 331/90; 315/39.57; 331/96; 333/13; 333/99 MP
[58] Field of Search ............................ 331/90, 86, 96; 315/39.55, 39.57; 333/99 MP, 13; 313/103 R, 104

[56] References Cited

U.S. PATENT DOCUMENTS

| 3,278,865 | 10/1966 | Forrer .................................... 333/13 |
| 3,543,135 | 11/1970 | O'Brien et al. ............. 333/99 MP X |
| 3,748,592 | 7/1973 | Pickering ............................. 331/90 |
| 3,885,221 | 5/1975 | Lewis ...................... 333/99 MP X |

Primary Examiner—Siegfried H. Grimm

[57] ABSTRACT

A multipactor discharge tuned resonant cavity device, e.g. a magnetron, is arranged with two multipactor discharge electrodes so that in a discharge condition a net current flows from one electrode to the other. The net current is used to create a self-bias voltage on one of the electrodes which affects the operating frequency of the device.

13 Claims, 6 Drawing Figures

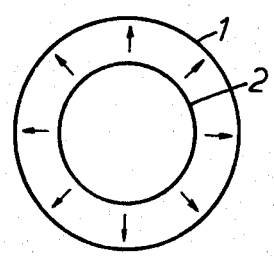
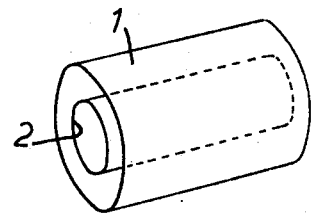
FIG. 1a.   FIG. 1b.
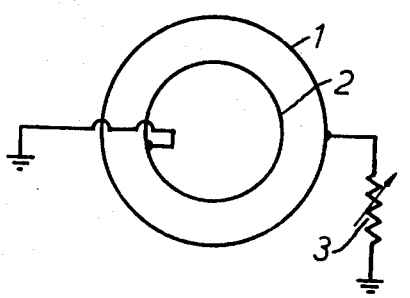
FIG. 2.
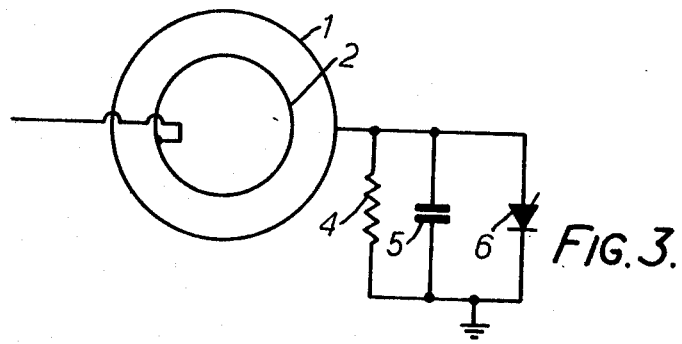
FIG. 3.

MULTIPACTOR DISCHARGE ARRANGEMENTS

This invention relates to multipactor discharge arrangements and more particularly to multipactor discharge arrangements utilised to tune microwave devices such as magnetron oscillators and other cavity resonators. It is known from our prior U.K. patent specification No. 1,334,001 and corresponding U.S. Pat. No. 3,748,592 to provide a separate resonator coupled to a cavity of a resonant cavity device (in this case, a magnetron oscillator) with a multipactor discharge arrangement arranged to influence the separate resonator in such manner that when said multipactor discharge arrangement is permitted to discharge (usually by removing a bias voltage) the operating frequency of the resonant cavity device changes from one discrete value to another. Other examples of the use of multipactor discharge arrangements for tuning purposes are the subject of our co-pending applications, Ser. Nos. 734,861 and 734,882, both filed on Oct. 22, 1976.

Hitherto multipactor discharge arrangements for use as above have, in practice, consisted of two or more planar parallel electrodes of which at least one is of secondary electron emitting material or bears secondary electron emitting material on a surface facing the surface of an adjacent electrode. If a sufficiently high radio frequency voltage is applied across two multipactor electrodes a discharge occurs. The voltage required to initiate discharge is commonly provided by the device whose resonant frequency is to be affected, and means are provided for applying a bias voltage to one of the electrodes to inhibit discharge when this is not required.

The present invention seeks to provide an improved multipactor discharge arrangement capable of producing an improved tuning effect in a resonant device whose operating frequency is to be controlled thereby.

According to this invention, a multipactor discharge arrangement is provided comprising at least two multipactor discharge electrodes which have a configuration such that in a discharge condition a net current flows from one electrode to another.

Preferably said multipactor discharge electrodes are in the form of co-axial cylinders.

With a multipactor arrangement in accordance with the present invention, unlike prior multipactor discharge arrangements utilising parallel planar electrodes, a net current flows between the two electrodes during a discharge condition. It has been found that this net current, when, for example, the multipactor discharge arrangement is utilised to tune a resonant cavity device such as a magnetron in accordance with the invention in our U.K. patent specification No. 1,334,001 and corresponding U.S. Pat. No. 3,748,592 may be utilised to create a self-bias voltage on one of the multipactor electrodes which has an effect on the operating frequency of the device once the multipactor discharge is initiated.

The net current may be utilised by providing a self-biassing resistor in the path for said net current whereby the net current passing between said electrodes during multipactor discharge, and hence the operating frequency of the device will depend on the value of said self-biassing resistor. Said self-biassing resistor may be fixed or variable. It is also possible to provide a resistive capacitive network in the path of said net current between said two electrodes whereby the operating frequency of said device will change over a range of frequencies when multipactor discharge is taking place. Normally again means, such as a triggerable diode, will be provided for discharging said network after a desired interval of time.

The invention is applicable both to C.W. and pulsed magnetron arrangements.

Figure 5:
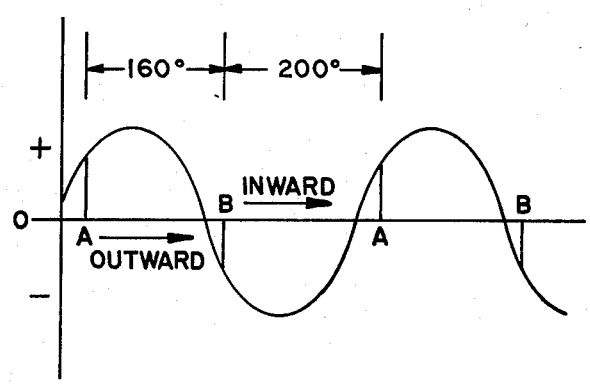

The invention is illustrated in and further described with reference to the accompanying drawing in which, FIGS. 1a and 1b schematically show a section and a perspective view of one multipactor discharge arrangement in accordance with the present invention, FIGS. 2 and 3 schematically illustrate the multipactor discharge arrangement of FIGS. 1a and 1b provided with typical self-biassing circuits, FIG. 4 illustrates the invention associated with a resonant cavity device; and FIG. 5 is a diagram illustrating the manner in which self-bias is developed.

Referring to FIGS. 1a and 1b, the multipactor discharge arrangement consists of two co-axial electrodes 1 and 2 both of which are of secondary electron emissive material e.g. beryllium-copper. As with prior multipactor discharge arrangements, if a suitable radio frequency voltage is applied across electrodes 1 and 2, a multipactor discharge will occur. During discharge, however, the net current flowing between the two electrodes is not zero, since the transit time of electrons from the surface of the inner electrode 2 to the surface of the outer electrode 1 is less than the transit time in the opposite direction, and the result is a net current of electrons flowing to the outer electrode 1.

Referring now to FIGS. 2 and 3, the multipactor discharge arrangement may be considered to be positioned to terminate a resonant co-axial transmission line coupled to two cavities of a magnetron oscillator as shown in FIG. 4, hereinafter described. Electrodes 1 and 2 correspond to electrodes 11 and 10 in FIG. 4. The electrodes 1 and 2 of which electrode 2 is at common potential, will be subjected whilst the magnetron oscillator is in operation continuously to a radio frequency electric field which is sufficient to cause a multipactor discharge to occur. Electrode 1 is connected to common potential via a self-biassing resistor 3, shown variable, which, due to the aforementioned net current passing between the electrodes 1 and 2, causes a biassing voltage to appear on electrode 1 which influences the operating frequency of the magnetron oscillator. Varying resistor 3 will vary this operating frequency over a range.

As disclosed in U.S. Pat. No. 3,748,592, a multipactor discharge arrangement may be employed to tune a magnetron oscillator. As disclosed therein, a resonant cavity is inductively coupled to one of the cavities of a magnetron oscillator so that when the magnetron is operated, the resonant cavity is strongly excited by rf energy coupled from the magnetron. The resonant cavity contains a multipactor discharge arrangement comprising two electrodes disposed in spaced relation and characterized by being secondary electron emissive. When the magnetron is operating and in the absence of electron discharge between the electrodes, the frequency of oscillation of the magnetron is "pulled" by the resonant cavity. When multipactor discharge occurs, the resonant cavity is effectively short circuited and the frequency of oscillation of the magnetron returns nearly to the resonant frequency thereof. The multipactor discharge may be stopped by applying a suitable d.c. voltage across the electrodes.

A resonant transmission line herein includes a multipactor discharge arrangement. However, unlike the multipactor discharge arrangement of the above patent, the multipactor device herein is formed by inner and outer co-axial cylinders.

The principles of the multipactor discharge arrangement of this invention will be apparent from FIG. 1a. As a natural consequence of having a coaxial transmission line, a radial electric field is produced as indicated by the arrows in this Figure. The transit time of an electron travelling between the two coaxial cylinders 1 and 2 is dependent upon the direction of transit and is due to the fact that the electric field gradient is greater near the inner cylinder 2 than near the outer cylinder 1 due to the curvatures of these electrodes. Thus, an electron released from the inner cylinder 2 is accelerated to high velocity more quickly, so that it crosses the gap between the two cylinders at a higher average velocity, i.e., in a shorter time than vice versa. For multipactor operation, the total transit angle back and forth has to be 360°. However, with the curved electrodes 1 and 2 the outwards transit angle may be say 160° and the inward transit angle may be say 200°. This is represented pictorially in FIG. 5 and, as will be seen, the instantaneous voltage at B, the outer electrode or cylinder 1, will be less than that at A, the inner electrode or cylinder 2. The magnitude of the space charge limited current is proportional to the instantaneous voltage at the moment of emission, and thus the outward current at A is greater than the inward current at B, so that there is in effect a rectification of the rf energy and production of d.c. current. It is this current which develops the self-bias across the resistor 3 of FIG. 2 or across the RC parallel circuit 4,5 of FIG. 3.

In any event, with the cylindrical multipactor discharge electrodes operating as part of a coaxial transmission line, and with the circuit having an external resistance, the system establishes a balance such that a d.c. voltage is developed corresponding to the net current as described above. Since $V=RI$, $R$ being the external resistance, both $V$ and $I$ must change as $R$ changes, and so must the phases of emission at both surfaces relative to the time of zero voltage. Since the reactance of the electron discharge depends on both the magnitude and phase of the electron currents, the end result of changing the external resistance R is to change the resistance of the electron discharge, and hence the resonant frequency of the cavity.

In FIG. 3 the outer electrode 1 is again connected via a resistor 4 to common potential.

In addition resistor 4 is shunted by a capacitor 5 so that a resistive capacitive network is formed. In this case, the self-bias voltage appearing on electrode 1 will increase until the capacitor 5 is fully charged. This causes the operating frequency of the magnetron oscillator correspondingly to vary automatically over a corresponding range. As shown a triggerable diode 6 may be connected across capacitor 5 by means of which the capacitor may be discharged and the cycle repeated.

Where the magnetron is operated in pulsed fashion and triggerable diode 6 is ignored, the effect achieved is that the frequency of each pulse will varying during that pulse and capacitor 5 will tend to discharge between pulses, via resistor 4, to provide a periodic modulation of the pulses.

With reference now to FIG. 4, a magnetron oscillator as shown therein includes a cylindrical anode member 21 surrounding a cylindrical cathode member 22. The anode member 21 is provided with radially inwardly extending vanes 23 which define or provide the cavities 24. A coaxial transmission line 25 is coupled to two adjacent ones of the resonant cavities 24, the reference characters for these two adjacent cavities bearing the suffix "C". The coaxial outer conductor 26 of the coaxial transmission line 25 terminates at the wall of the anode member 21 while the inner conductor 27 extends through a hole 28 in the wall of the anode member 21 and is connected to that one of the vanes 23C which is between the two adjacent cavities 24C. The multipactor discharge arrangement 29 is provided to terminate the end of the transmission line 25 remote from the wall of the anode member 21. As noted previously, the inner electrode 10 of FIG. 4 corresponds to the inner electrode 2 of FIGS. 1A, 1B, 2 and 3 whereas the outer electrode 11 of FIG. 4 corresponds to the electrode 1 of the previous Figures.

It will be noted that the frequency control achieved in accordance with the present invention as described above does not require an additional source of control potential since the biassing voltage is developed by self-bias.

We claim:

1. A multipactor discharge arrangement comprising a source of radio frequency energy, two multipactor discharge electrodes arranged such that one surrounds the other to form a co-axial waveguide which is coupled to said source of radio frequency energy whereby, in operation, in a multipactor discharge condition a net current flows from one of said multipactor discharge electrodes to the other, and means connected to utilize such net current to create a self-bias voltage on one of the electrodes.

2. An arrangement as claimed in claim 1 and wherein said multipactor discharge electrodes are in the form of co-axial cylinders.

3. A multipactor tuned resonant cavity device arrangement including a multipactor discharge arrangement as claimed in claim 1 operable to tune the resonant cavity device of said resonant cavity arrangement and wherein means are provided for utilising said net current to create a self-bias voltage on one of the multipactor electrodes which has an effect on the operating frequency of the device once the multipactor discharge is initiated.

4. An arrangement as claimed in claim 3 and wherein said last mentioned means comprises a self-biassing resistor provided in the path for said net current whereby the net current passing between said electrodes during multipactor discharge, and hence the operating frequency of the device will depend on the value of said self-biassing resistor.

5. An arrangement as claimed in claim 4 and wherein said resistor is of fixed value.

6. An arrangement as claimed in claim 4 and wherein said resistor is of variable value.

7. An arrangement as claimed in claim 3 and wherein said last mentioned means comprises a resistive capacitive network in the path of said net current between said two electrodes whereby the operating frequency of said device will change over a range of frequencies when multipactor discharge is taking place.

8. An arrangement as claimed in claim 7 and wherein means are provided for discharging said network after a desired interval of time.

9. An arrangement as claimed in claim 3 wherein said resonant cavity device is a C.W. or pulsed magnetron.

10. A multipactor discharge arrangement comprising, in combination:
   a source of rf energy;
   coaxial waveguide means coupled to said source for receiving rf energy therefrom in which a radial electric field is present; and
   a multipactor discharge device forming part of said coaxial waveguide means, said device comprising an inner electrode and an outer electrode surrounding said inner electrode whereby in response to multipactor discharge between said electrodes a net current of electrons flows to said outer electrode and resistor means connected between said inner and outer electrodes for creating a self-bias voltage on said outer electrode across said resistor means due to said net current.

11. A multipactor discharge arrangement as defined in claim 10 wherein said source of rf energy is a resonant cavity device.

12. A multipactor discharge arrangement as defined in claim 11 wherein said inner and outer electrodes are in the form of coaxial cylinders.

13. A multipactor discharge arrangement comprising, in combination:
   a resonant cavity device;
   coaxial waveguide means coupled to said resonant cavity device and including an inner conductor extending into said device and an outer conductor; and
   multipactor discharge means forming part of said coaxial waveguide means for affecting the operating frequency of said device during multipactor discharge, said multipactor discharge means comprising an inner electrode connected to said inner conductor and an outer electrode connected to said outer conductor and surrounding said inner electrode whereby a net electron current flows to said outer electrode during multipactor discharge, and reactance means connected between said inner and outer electrodes for creating a self-bias voltage on said outer electrode during multipactor discharge.

* * * * *